United States Patent [19]
Tietjen et al.

[11] Patent Number: 5,917,761
[45] Date of Patent: Jun. 29, 1999

[54] SYNCHRONOUS MEMORY INTERFACE

[75] Inventors: Donald L. Tietjen; Terry L. Biggs, both of Austin, Tex.

[73] Assignee: Motorola Inc., Austin, Tex.

[21] Appl. No.: 08/965,640

[22] Filed: Nov. 6, 1997

[51] Int. Cl.⁶ .................................... G11C 7/00
[52] U.S. Cl. ........................ 365/194; 365/233; 365/233.5
[58] Field of Search ................................ 365/194, 233, 365/233.5

[56] References Cited

U.S. PATENT DOCUMENTS

| | | | |
|---|---|---|---|
| 5,646,904 | 7/1997 | Ohno et al. | 365/233 |
| 5,652,733 | 7/1997 | Chen et al. | 365/233 |
| 5,768,177 | 6/1998 | Sakuragi | 365/194 |
| 5,781,499 | 7/1998 | Koshikawa | 365/194 |
| 5,781,500 | 7/1998 | Oh | 365/194 |

*Primary Examiner*—David Nelms
*Assistant Examiner*—Tuan T. Nguyen
*Attorney, Agent, or Firm*—Daniel D. Hill

[57] ABSTRACT

A synchronous memory interface feeds back a buffered (34) clock signal to a microcontroller (20) to simplify and improve output hold time for the memory (38). An output delay circuit (36) in the microcontroller (20) is controlled by the same delayed clock signal as the synchronous memory (38). This delay circuit (36) selectively delays memory signals to the synchronous memory (38) from the microcontroller delay circuit (36). The use of flip-flops (40, 44) in the delay circuit (36) provides a mechanism for scan testing. This enables three different selectable modes of operation of the delay circuit (36) providing flexibility in interfacing in different environments.

16 Claims, 5 Drawing Sheets

SYNCHRONOUS MEMORY INTERFACE

FIELD OF THE INVENTION

The present invention generally relates to data processing systems, and more specifically to interfacing a microcontroller (MCU) to an external synchronous dynamic random access memory (SDRAM).

BACKGROUND OF THE INVENTION

As data processing system bus speeds increase there has been a movement from asynchronous to synchronous memory interfaces. This is especially true for dynamic random access memories (DRAM), due to their relatively slow access speeds. A synchronous interface allows for a significantly faster interface. One speed disadvantage of an asynchronous memory system is that transactions are initiated and completed atomically. Therefore each transaction must be completed before the next transaction is begun. Synchronous memory interfaces allow various stages of the transaction to be pipelined, where requests to the memory and responses from the memory are overlapped.

Although synchronous memories provide speed advantages, they also create unique problems with respect to timing and clocking. This becomes a special burden for a system designer trying to implement a cost effective solution while at the same time meeting design specifications for the devices in a system. Hold times may be very difficult to meet, both from the perspective of the memory and the perspective of a processor. In the microcontroller environment, this can be even more difficult if bus clocks are derived from input signals of different frequencies or large skews with respect to the input clock. Bus specifications may be related to output clocks, and so a simple clock tree arrangement will not guarantee synchronous clocks.

FIG. 1 is a prior art timing diagram of an interface between a micro controller and a synchronous memory. Three signals are illustrated: clock out, SDRAM control out, and SDRAM clock. The clock out signal is generated by the data processing system. The bus specifications are defined with respect to this clock out signal. The SDRAM control out signal is generated by the data processing system and is recognized by a synchronous (SDRAM) memory. The SDRAM clock is the input clock to the synchronous DRAM (SDRAM) memory. Two time intervals are illustrated in FIG. 1. The first period is the output hold time for the data processing system. This is the minimum amount of time between a rising clock edge transition and the transition of an output to the memory. The other time period illustrated is the DRAM input hold time requirement. This is the minimum amount of time that a signal must be held after the DRAM input clock rising edge transition to be successfully recognized. In this illustration, the output hold time is two nanoseconds and the DRAM input hold time requirement is one nanosecond. The result is that the difference, one nanosecond, is the maximum skew allowed between the clock out of the data processing system and the clock into the SDRAM. This minimum skew requirement greatly increases the design complexity required in designing a system using synchronous DRAM (SDRAM). It should be noted that there is a similar requirement for data returning to the micro controller from a synchronous memory.

Prior to this invention, the problem has been solved with relatively expensive external hardware, such as a phased locked loop (PLL), and rigorous circuit board design to tightly control the skew of the clocks.

It would therefore be advantageous to provide a system solution which would allow the setup and hold time requirements of the devices within the system to easily be achieved without rigorous control of the clocks. This would significantly simplify the system design of an interface to a synchronous memory.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION

Generally, the present invention provides a circuit for interfacing a microcontroller to an external synchronous dynamic random access memory (SDRAM) that solves the timing problem of the prior art by feeding back the output clock signal for controlling the timing of the SDRAM to output delay 36. This feedback clock signal is used to control the output registers of output delay 36 that data, address, and control signal to the SDRAM. By feeding back the clock signal, a gate delay caused by buffering the clock signal improves hold times of the SDRAM relative to the microcontroller. Also, feeding back the clock signal matches the output of data processing system 20 with the input hold times of the SDRAM without requiring complex timing control circuits.

Figure 2:
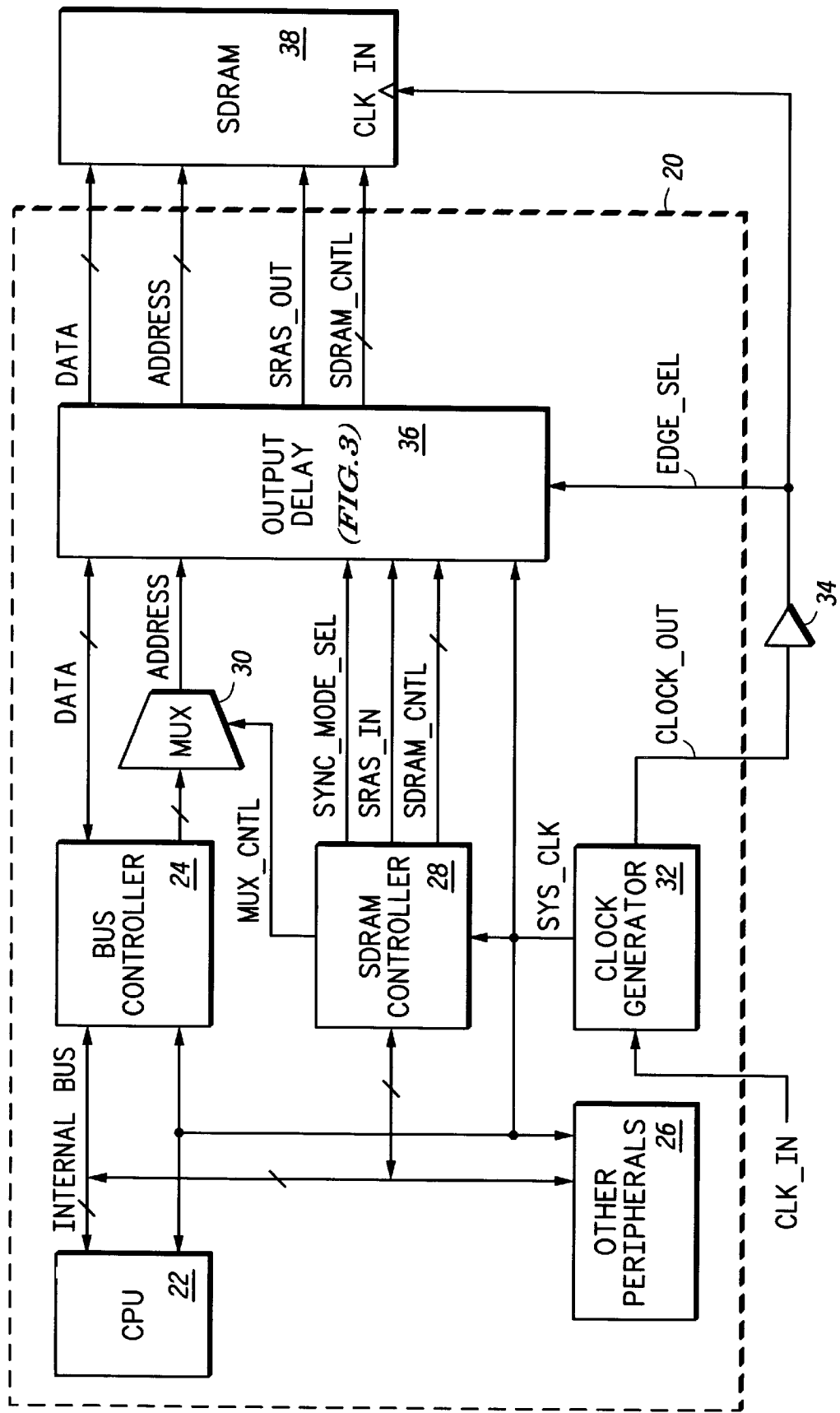
FIG. 2 illustrates, in block diagram form, a data processing system in accordance with the present invention.

FIG. 2 illustrates, in block diagram form, a data processing system 20 in accordance with the present invention. Data processing system 20 includes a central processing unit (CPU) 22, a bus controller 24, other peripherals 26, SDRAM controller 28, clock generator 32, output delay 36 and multiplexer 30. In the illustrated embodiment, data processing system 20 is a microcontroller (MCU) coupled to a synchronous dynamic random access memory (SDRAM) 38. CPU 22 is coupled to bus controller 24 via a bus labeled "INTERNAL BUS". Also SDRAM controller 28 and other peripherals 26 are coupled to the INTERNAL BUS. Bus controller 24 includes a plurality of bidirectional terminals for both receiving and providing data signals labeled "DATA". Bus controller 24 also includes a plurality of output terminals for providing address signals labeled "ADDRESS". SDRAM controller 28 provides a select signal labeled SYNC_MODE_SEL, a RAS control signal labeled "SRAS_IN" and a plurality of conventional SDRAM control signals labeled "SDRAM_CNTL". Mux 30 receives addresses from the bus controller 24 and multiplexes them to be compatible with standard DRAM operation. Output delay 36 receives data signals from bus controller 24, address signals from mux 30, and the control signals from SDRAM controller 28. In response, output delay 36 provides data signals labeled "DATA", address signals labeled "ADDRESS", a control signal labeled "SRAS_OUT", and plurality of plurality of conventional SDRAM control signals also labeled "SDRAM_CNTL" for accessing and controlling an external SDRAM 38. Note that for convenience, some of the signals entering and leaving output delay 36 have the same name.

Clock generator 32 receives an input clock signal labeled "CLK_IN", and in response, provides a system clock signal labeled SYS_CLK to each of the modules of data processing system 20. In addition, clock generator 32 provides an output clock signal labeled "CLOCK_OUT" to an output terminal of data processing system 20. An application using data processing system 20 may include an external buffer circuit such as buffer 34 to provide a buffered clock signal labeled "EDGE_SEL" to a clock input terminal of SDRAM 38 and as the feedback signal to output delay 36. In some embodiments, buffer 34 may be included on data processing system 20, or may be omitted.

Other peripherals 26 includes various other module circuits for performing communications, timing and other processing tasks for data processing system 20, such as for example, a serial communications interface module (SCI), a general purpose timer, direct memory access module, or additional memory.

In operation, when SDRAM controller 28 recognizes that an access is requested to SDRAM 38, SDRAM controller 28 receives control of multiplexer 30 and asserts select signal SYNC_MODE_SEL as an active high to output delay 36, indicating that the access is to synchronous DRAM 38. When select signal SYNC_MODE_SEL is a logic low, output delay 36 may be used to access another type of memory, such as static random access memory (SRAM), or a type of non-volatile memory such as read-only-memory (ROM), or electrically erasable read-only-memory (EEPROM). When the access is to SDRAM 38, SDRAM controller 28 asserts the appropriate control signals to control the access of SDRAM 38. SDRAM 38 is a conventional SDRAM and is accessed in a conventional manner and therefore will not be discussed in detail.

The clock timing for SDRAM 38 is provided by data processing system 20 via buffer 34. The output of buffer 34 is then fed back to output delay 36 to cause the output signals from output delay 36 to match the required timing of SDRAM 38 thereby matching the output timing of output delay 36 with the input timing of SDRAM 38.

Note that in other embodiments, SDRAM 38 may be replaced with other types of synchronous memory such as a synchronous SRAM.

Figure 1:
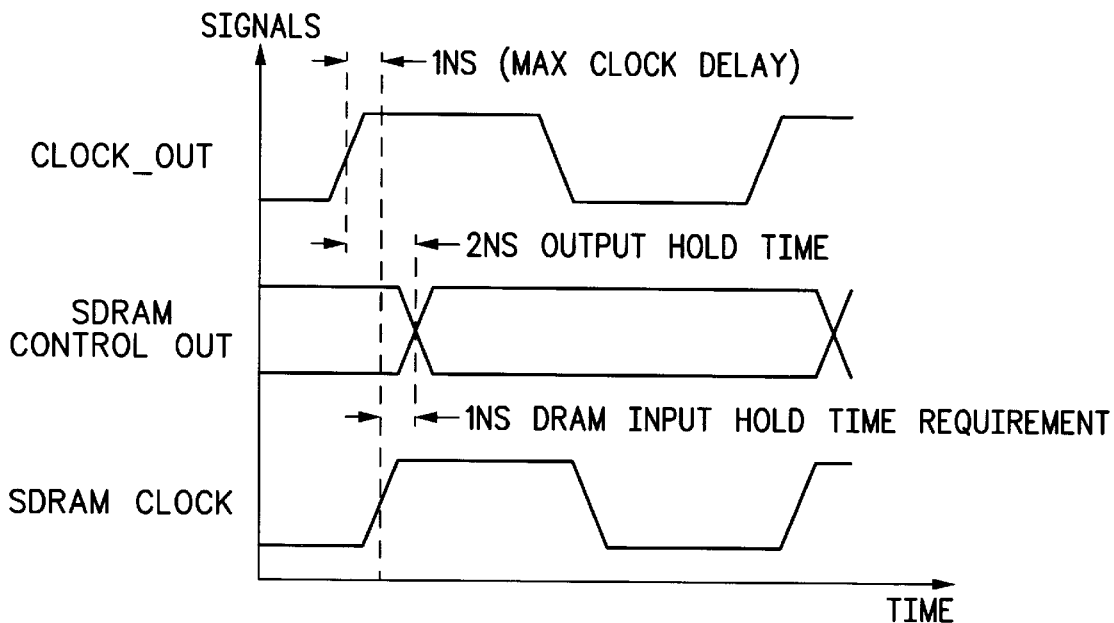
FIG. 1 is a prior art timing diagram of an interface between a micro controller and a synchronous memory.
Figure 3:
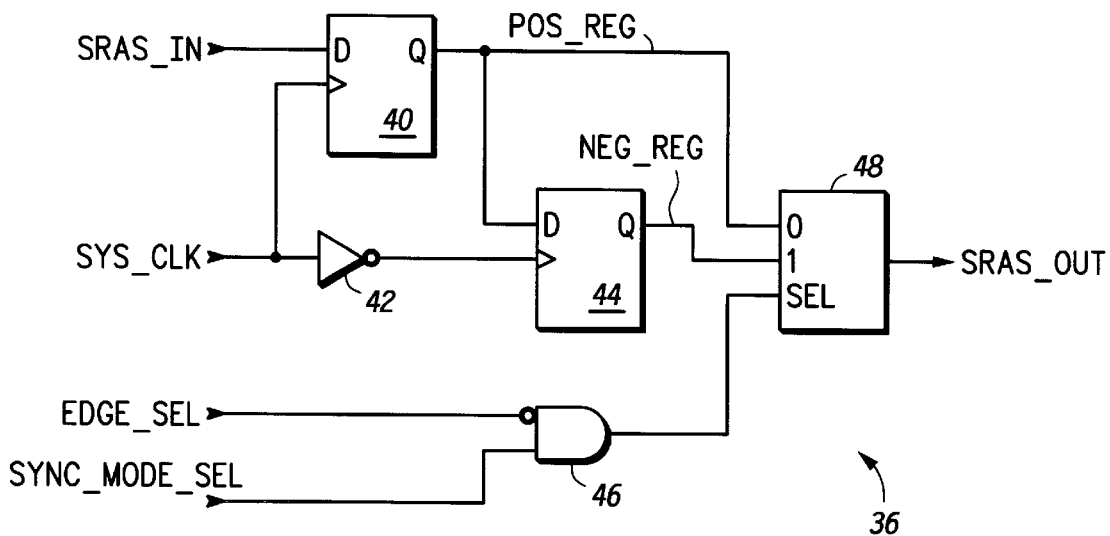
FIG. 3 illustrates, in logic diagram form, a portion of output delay in accordance with the present invention.

FIG. 3 illustrates, in logic diagram form, a portion of output delay 36 in accordance with the present invention. The circuit illustrated in FIG. 3 is one example of an output of output delay 36 of FIG. 2. All of the other output signals including DATA and ADDRESS include circuits similar to the circuit illustrated in FIG. 3. For example, FIG. 3 illustrates the circuit for outputting the SRAS_OUT signal. In the case of DATA signals the circuit of FIG. 3 is applicable if SRAS_IN and SRAS_OUT are replaced with data signals.

The portion of output delay 36 illustrated in FIG. 3 includes flip-flops 40 and 44, inverter 42, multiplexer 48 and AND logic gate 46. Flip-flop 40 has an input terminal for receiving RAS signal SRAS_IN. A clock input signal for receiving SYS_CLK and an output terminal for providing an output signal, labeled "POS_REG", that changes on a rising edge of clock signal SYS_CLK. Inverter 42 has an input terminal for receiving SYS_CLK and an output terminal. Flip-flop 44 has an input terminal coupled to the output terminal of flip flop 40, a clock input terminal coupled to the output terminal of inverter 42, and an output terminal for providing an output signal labeled "NEG_REG", that changes on a falling edge of clock signal SYS_CLK. Multiplexer 48 has a first input terminal, labeled "0", coupled to the output terminal of flip-flop 40, a second input terminal, labeled "1", coupled to the output terminal of flip-flop 44, a select terminal, and an output terminal. AND logic gate 46 has an inverted first input terminal for receiving a select signal labeled "EDGE_SEL", a second input terminal for receiving SYNC_MODE_SEL, and an output terminal coupled to the select terminal of multiplexer 48.

In operation, output delay 36 provides three modes of operation: (1) a feedback delay mode, where the output of output delay 36 follows the rising edge of a toggling EDGE_SEL signal; (2) a positive edge mode, where an output of output delay 36 follows the rising clock edge of clock signal SYS_CLK; and (3) a negative edge mode, where the output of output delay 36 follows the falling edge of clock signal SYS_CLK.

When select signal SYNC_MODE_SEL is negated, or a logic low, multiplexer 48 couples the output of flip-flop 40 to the output of multiplexer 48. This allows a non-SDRAM access using output delay 36 that uses the rising edge of SYS_CLK.

Output delay 36 is enabled for an SDRAM access when select signal SYNC_MODE_SEL is asserted as a logic high.

The operation of output delay 36 of FIG. 3 will now be discussed in connection with the timing diagrams of FIGS. 4–6. When select signal SYNC_MODE_SEL is a logic high, the output of AND logic gate 46 is dependent on the logic state of EDGE_SEL.

Figure 4:
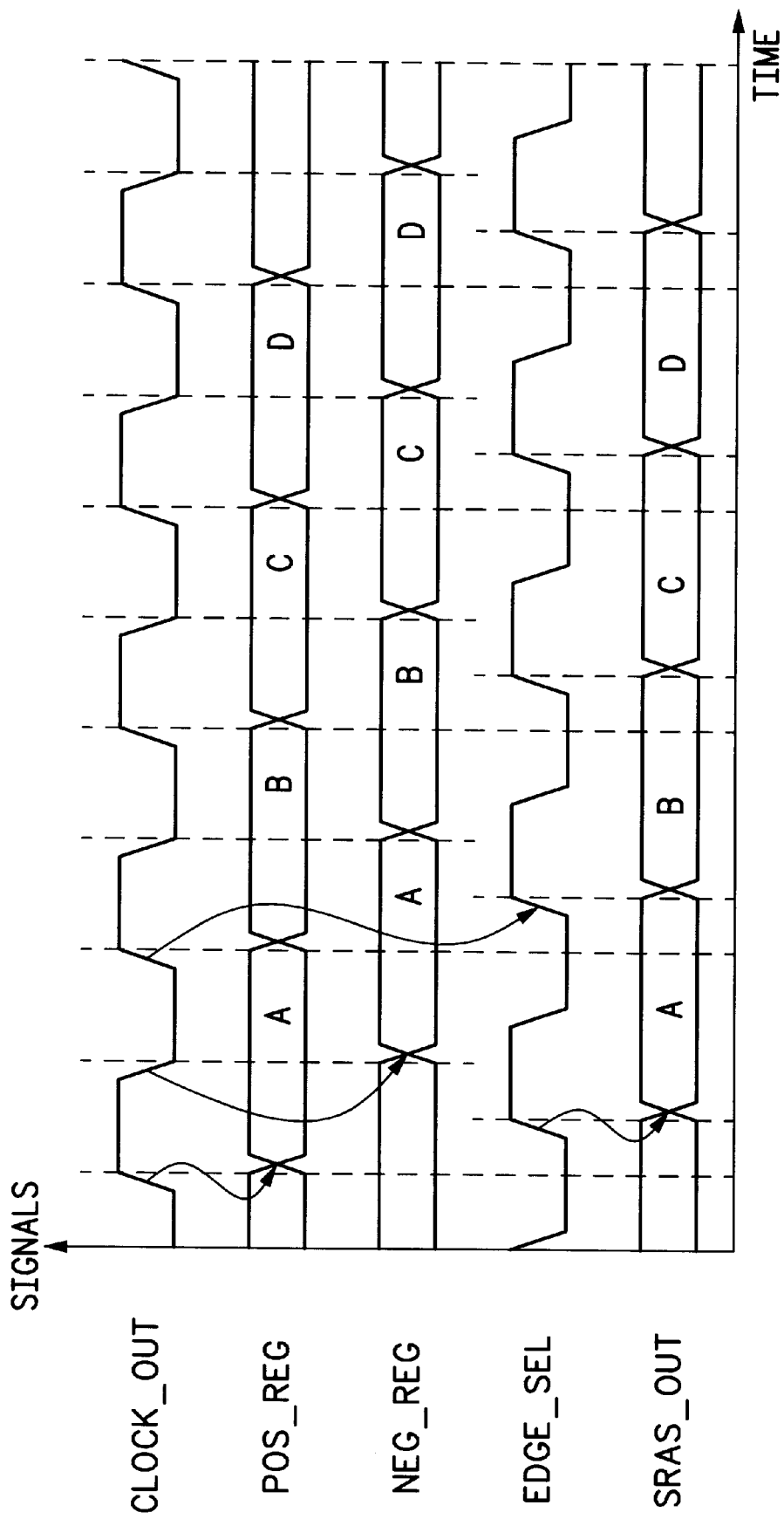
FIG. 4 illustrates a timing diagram of various signals of output delay of FIG. 3 during the feedback delay mode.

FIG. 4 illustrates a timing diagram of various signals of output delay 36 during the feedback delay mode. In the feedback delay mode, feedback clock signal EDGE_SEL toggles in response to the CLOCK_OUT signal of clock generator 32. However, EDGE_SEL is delayed by an amount equal to the delay of buffer 34. When EDGE_SEL rises, the output of AND logic gate 46 causes the first input terminal of multiplexer 48 to be provided at the output of multiplexer 48, and when EDGE_SEL falls multiplexer 48 couples the output of flip-flop 44 to the output of multiplexer 48. Since the input of flip-flop 44 is connected to the output of flip-flop 40 then the output of multiplexer 48 does not change during as EDGE_SEL transitions from a logic high to a logic low because both flip-flops are providing the same information.

Because the output of output delay 36 is triggered by EDGE_SEL, the input hold time of the output signals of output delay 36, such as for example SRAS_OUT, is shifted to match the output signals to the clock input signals of SDRAM 38. This matches the output signals of output delay 36 to the clock signal of SDRAM 38 so that the problems as discussed above in the background are avoided without using a complex clocking scheme.

Figure 5:
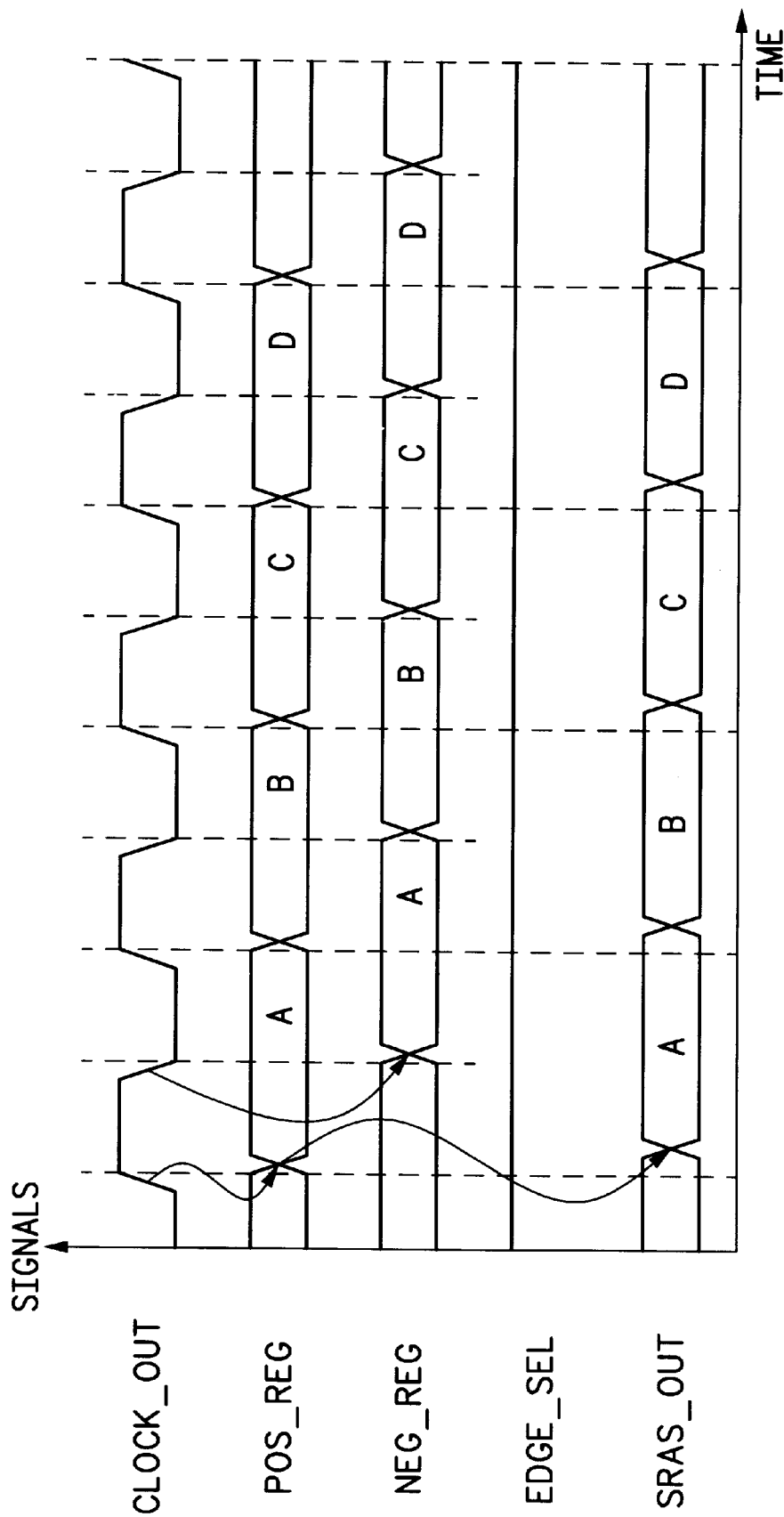
FIG. 5 illustrates a timing diagram of various signals of output delay of FIG. 3 during the positive edge mode of operation.

FIG. 5 illustrates a timing diagram of various signals of output delay 36 of FIG. 3 during the positive edge mode of operation. In this mode of operation, the output of buffer 34 is not fed back to output delay 36, and select signal EDGE_SEL is held at a logic high causing the output of AND logic gate 46 to provide a logic low at its output terminal. This selects the first input terminal (labeled "0") of multiplexer 48 to provide the output of flip-flop 40 at the output terminal of multiplexer 48. This is used in applications where the feedback delay mode is not required and the SDRAM control signal is required to change on the rising edge of the system clock signal.

Figure 6:
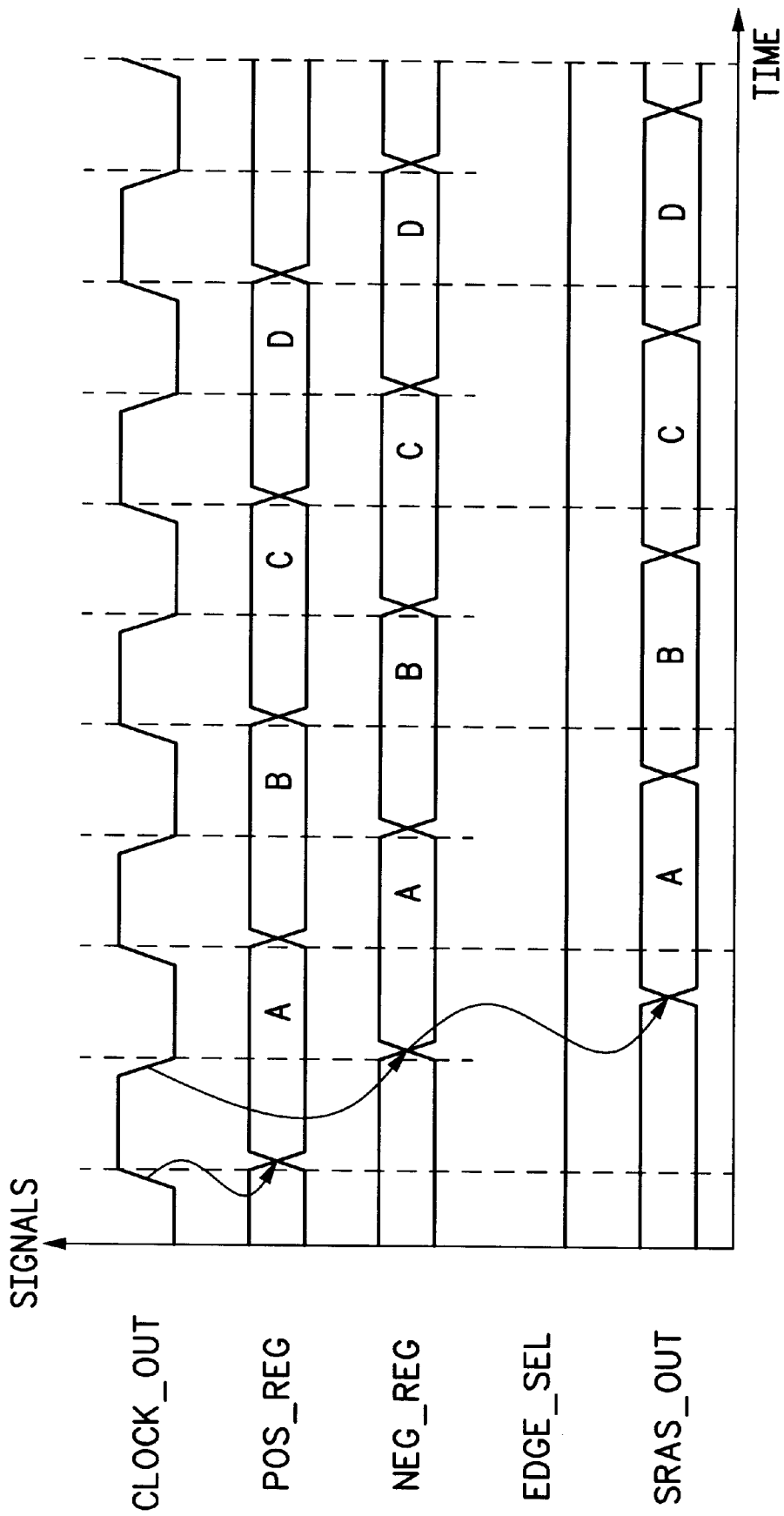
FIG. 6 illustrates a timing diagram of various signals of output delay of FIG. 3 during the negative edge mode of operation.

FIG. 6 illustrates a timing diagram of various signals of output delay 36 during the negative edge mode of operation. In FIG. 6, select signal EDGE_SEL is held at a logic low causing the second input terminal (labeled "1") of multiplexer 48 to be coupled to the output of multiplexer 48. This is used in applications where the feedback delay mode is not required and it is desirable that the output of output delay 36 depend on a falling edge of the system clock signal.

Because flip-flops 40 and 44 are utilized, scan testing of data processing system 20 is also supported.

Those skilled in the art will recognize that modifications and variations can be made without departing from the spirit of the invention. Therefore, it is intended that this invention encompass all such variations and modifications as fall within the scope of the appended claims.

Claim elements and steps herein have been numbered and/or lettered solely as an aid in readability and understanding. As such, the numbering and/or lettering in itself is not intended to and should not be taken to indicate the ordering of elements and/or steps in the claims.

What is claimed is:

1. A data processing system comprising:
   a memory controller;
   an output delay circuit responsively coupled to the memory controller receiving a plurality of memory signals and generating a plurality of delayed memory interface signals;
   a clock output terminal for providing a clock output signal; and
   a feedback clock terminal for receiving the clock output signal delayed by a delay circuit as a delay feedback signal and providing the delay feedback signal to the output delay circuit as an edge select signal, wherein:
   the edge select signal provides a reference delay based on delay of the clock output signal by the delay circuit for the plurality of memory signals driven from the memory controller through the output delay circuit to a corresponding plurality of memory interface terminals.

2. The data processing system in claim 1 wherein:
   the output delay circuit selectively delays the plurality of memory signals depending on whether a selected memory is a synchronous memory.

3. The data processing system in claim 1 which has a plurality of selectable modes.

4. The data processing system in claim 3 wherein:
   one of the plurality of selectable modes is a positive edge mode.

5. The data processing system in claim 3 wherein:
   one of the plurality of selectable modes is a negative edge mode.

6. The data processing system in claim 3 wherein:
   one of the plurality of selectable modes is a feedback delay mode.

7. The data processing system in claim 1 which further comprises:
   a clock generator that generates the clock output signal to the clock output terminal and to the memory controller.

8. The data processing system in claim 1 wherein the output delay circuit comprises:
   a first flip-flop having:
      an input receiving one of the plurality of memory signals,
      a clock receiving the clock output signal, and
      providing a first flip-flop output signal;
   means for inverting the clock output signal to an inverted clock signal;
   a second flip-flop having:
      an input receiving the first flip-flop output signal,
      a clock receiving the inverted clock signal, and
      providing a second flip-flop output signal;
   an AND function:
      a first input receiving the edge select signal,
      a second input receiving a sync mode select signal, and
      providing an AND function output signal; and
   a mux having:
      a first input receiving the first flip-flop output signal,
      a second input receiving the second flip-flop output signal,
      a selector input receiving the AND function output signal, and
      providing a mux output as one of the plurality of delayed memory interface signals, wherein the selector input selects one of a set of the first input and the second input as the mux output.

9. A data processing system comprising:
   a memory controller that generates a plurality of memory signals;
   an output delay circuit that receives the plurality of memory signals and generates a plurality of delayed memory interface signals;
   a memory that receives the plurality of delayed memory interface signals;
   a clock that provides a clock output signal to the memory controller; and
   a delay circuit that receives the clock output signal and delays the clock output signal to provide a delayed clock output signal as an edge select signal, wherein:
   the edge select signal provides a reference delay based on delay of the clock output signal by the delay circuit for the plurality of memory signals driven from the memory controller through the output delay circuit as the plurality of delayed memory interface signals to the memory.

10. The data processing system in claim 9 wherein:
    the output delay circuit selectively delays the plurality of memory signals depending on whether a selected memory is a synchronous memory.

11. The data processing system in claim 9 which has a plurality of selectable modes.

12. The data processing system in claim 11 wherein:
    one of the plurality of selectable modes is a positive edge mode.

13. The data processing system in claim 11 wherein:
    one of the plurality of selectable modes is a negative edge mode.

14. The data processing system in claim 11 wherein:
    one of the plurality of selectable modes is a feedback delay mode.

15. The data processing system in claim 9 wherein the output delay circuit comprises:
    a first flip-flop having:
       an input receiving one of the plurality of memory signals,
       a clock receiving the clock output signal, and providing a first flip-flop output signal;
means for inverting the clock output signal to an inverted clock signal;
a second flip-flop having:
   an input receiving the first flip-flop output signal,
   a clock receiving the inverted clock signal, and
   providing a second flip-flop output signal;
an AND function:
   a first input receiving the edge select signal,
   a second input receiving a sync mode select signal, and
   providing an AND function output signal; and
a mux having:
   a first input receiving the first flip-flop output signal,
   a second input receiving the second flip-flop output signal,
   a selector input receiving the AND function output signal, and
   providing a mux output as one of the plurality of delayed memory interface signals, wherein the selector input selects one of a set of the first input and the second input as the mux output.

16. An output delay circuit receiving a memory interface signal, a clock signal, an edge select signal, and a sync mode select signal, and generating a delayed memory interface signal, said output delay circuit comprising:

a first flip-flop having:
   an input receiving the memory interface signal,
   a clock receiving the clock signal, and
   providing a first flip-flop output signal;
a second flip-flop having:
   an input receiving the first flip-flop output signal,
   a clock receiving an inverted clock signal, and
   providing a second flip-flop output signal;
an AND function:
   a first input receiving the edge select signal,
   a second input receiving the sync mode select signal, and
   providing an AND function output signal; and
a mux having:
   a first input receiving the first flip-flop output signal,
   a second input receiving the second flip-flop output signal,
   a selector input receiving the AND function output signal, and providing a mux output as the delayed memory interface signal, wherein the selector input selects one of a set of the first input and the second input as the mux output.

* * * * *